US006559379B2

(12) United States Patent
Solanki et al.

(10) Patent No.: US 6,559,379 B2
(45) Date of Patent: May 6, 2003

(54) PRESSURE SENSOR WITH TRANSDUCER MOUNTED ON A METAL BASE

(75) Inventors: Dinesh Solanki, Santa Clara, CA (US); Janusz Bryzek, Fremont, CA (US)

(73) Assignee: NovaSensor, Inc., Fremont, CA (US)

( * ) Notice: Subject to any disclaimer, the term of this patent is extended or adjusted under 35 U.S.C. 154(b) by 0 days.

(21) Appl. No.: 09/815,900

(22) Filed: Mar. 22, 2001

(65) Prior Publication Data

US 2001/0009195 A1 Jul. 26, 2001

Related U.S. Application Data

(63) Continuation of application No. 08/949,850, filed on Oct. 14, 1997, now abandoned, which is a continuation of application No. 08/393,956, filed on Feb. 24, 1995, now abandoned.

(51) Int. Cl.[7] .................................................. H05K 5/06
(52) U.S. Cl. ........................ 174/52.2; 174/52.4; 257/676
(58) Field of Search ............................... 174/52.2, 52.4; 257/676, 675, 712, 713; 73/727, 756

(56) References Cited

U.S. PATENT DOCUMENTS

| 4,649,415 A | 3/1987 | Hebert |
| 4,655,088 A | 4/1987 | Adams |
| 4,686,764 A | 8/1987 | Adams et al. |
| 4,850,227 A | 7/1989 | Luettgen et al. |
| 4,984,466 A | 1/1991 | Yasui et al. |
| 5,139,973 A | 8/1992 | Nagy et al. |
| 5,207,102 A | 5/1993 | Takahashi et al. |
| 5,239,806 A | 8/1993 | Maslakow |
| 5,263,241 A | 11/1993 | Hart, Jr. et al. |
| 5,263,242 A | 11/1993 | Singh Deo et al. |
| 5,289,344 A | 2/1994 | Gagnon et al. |
| 5,386,342 A | 1/1995 | Rostoker |
| 5,394,751 A | 3/1995 | Ishibashi |
| 5,424,249 A | 6/1995 | Ishibashi |
| 5,436,407 A | 7/1995 | Fehr et al. |
| 5,436,492 A | 7/1995 | Yamanaka |
| 5,436,500 A | 7/1995 | Park et al. |
| 5,457,341 A | 10/1995 | West |
| 5,471,011 A | 11/1995 | Maslakow |
| 5,483,098 A | 1/1996 | Joiner et al. |
| 5,483,740 A | 1/1996 | Maslakow |
| 5,543,657 A * | 8/1996 | Diffenderfer et al. ........ 257/666 |
| 5,760,467 A * | 6/1998 | Itihasi ........................ 257/676 |
| 6,303,985 B1 * | 10/2001 | Larson et al. ............... 257/676 |

FOREIGN PATENT DOCUMENTS

| DE | 32 00 448 | 7/1983 |
| EP | 0 286 867 | 10/1988 |

* cited by examiner

*Primary Examiner*—Hung V. Ngo
(74) *Attorney, Agent, or Firm*—Morrison & Foerster LLP

(57) ABSTRACT

A three piece housing, designed to house semiconductor chips is molded using a polymer material. The chip sits on a metal base. Electrical leads pass through a molded housing to provide electrical contact between the semiconductor chip and external circuitry.

31 Claims, 5 Drawing Sheets

PRESSURE SENSOR WITH TRANSDUCER MOUNTED ON A METAL BASE

BACKGROUND OF THE INVENTION

1. Field of the Invention

The invention relates, in general, to pressure sensors, and more particularly, to a pressure sensors mounted in polymer housings.

2. Description of the Related Art

Semiconductor pressure sensors have been around for some time, and are generally packaged in either a one-piece or two-piece housing. In both of these types of packages, the actual transducer device generally is mounted on a base formed from a polymer material. U.S. Pat. No. 4,655,088 entitled, Unibody Pressure Transducer Package, discloses a one piece housing for mounting a semiconductor transducer. The housing is molded from a polymer material. Electrical leads pass through the one piece housing to provide electrical contact between the semiconductor transducer and outside circuitry. The transducer is mounted on a base portion of the polymer housing.

One problem with mounting a semiconductor transducer in a polymer housing arises due to a mismatch in thermal coefficients of expansion (TCE). The transducer ordinarily is secured to the polymer base using room temperature vulcanization (RTV). The RTV adhesive acts as a buffer to compensate for significant differences in the TCEs of the polymer housing and the semiconductor transducer. Differences in TCEs can be important. For example, it is conceivable that a packaged semiconductor transducer will be mounted on the inside of an automobile tire. Certain regions of the country such as, Michigan in the winter may be very cold, and other regions of the country, such as Florida in the summer may be very hot. The performance of the semiconductor transducer may be impacted by temperature changes which cause the semiconductor transducer and the polymer to expand or to contract at different rates consistent with their different TCEs.

Another problem which may be experienced by a semiconductor transducer is interference from radio frequency (RF) signals. Using the above example, a packaged semiconductor transducer may be secured within an automobile tire in order to monitor pressure within the tire. Pressure readings provided by the sensor may be read using radio frequency signals. For example, an external device may transmit RF signals to and receive RF signals from a circuit board on which the pressure sensor is mounted within the tire. These same RF signals, however, may impact the performance of the transducer. Hence, there may be a need to protect the transducer from the effects of RF signals.

A challenge in the manufacture of pressure sensors has been achieving wire bonds between metal leads which pass through a housing and a semiconductor transducer mounted inside the housing. U.S. Pat. No. 4,686,764 entitled. Membrane Protected Pressure Sensor, discloses a semiconductor sensor mounted in a housing and wire bonded to a metal lead. One technique for achieving the wire bonding is to heat a lead frame which bears the metal leads in order to heat the semiconductor transducer sufficiently to affect a bonding between the lead, the wire bond and the transducer. This technique typically requires a transfer of heat from the metal lead to the housing and then to the semiconductor transducer. Unfortunately, there can be difficulties with this mechanism for the transference of heat energy since the housing material may transmit heat less efficiently than the metal lead.

Thus, there has been a need for an improved semiconductor sensor in which there is a better match of TCEs of a semiconductor transducer and a base on which the transducer rests, which can better withstand the effects of RF interference, and which can more effectively use wire bonding techniques during production. The present invention needs these.

SUMMARY OF THE INVENTION

A pressure sensor is provided in which a metal base pad is molded into a polymer housing. A semiconductor transducer is placed on the metal base pad. A cap is attached to the housing to form a protective chamber in which the transducer is mounted on the base pad. A vent hole provides access to a measurand environment.

The metal base pad has a thermal co-efficient of expansion closely matched to that of the semiconductor transducer. Moreover. when the metal base pad is electrically grounded it provides a degree of protection from RF signals. Additionally, during wire bonding, the metal pad serves as an effective conductor of heat to the semiconductor transducer.

DETAILED DESCRIPTION OF THE PREFERRED EMBODIMENTS

The present invention comprises a novel pressure sensor with a transducer mounted on a metal base. The following description is presented to enable any person skilled in the art to make and use the invention. Descriptions of specific applications are provided only as examples. Various modifications to the preferred embodiment will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
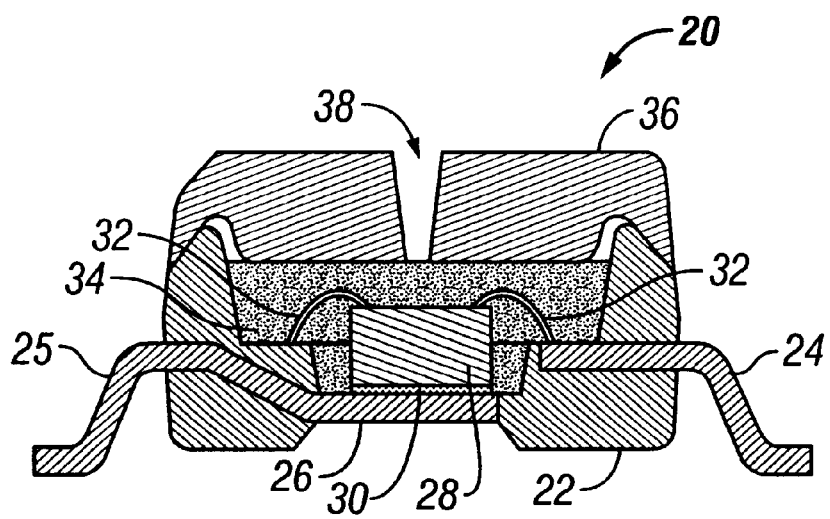
FIG. 1 is a cross-sectional view of a pressure sensor in accordance with a first embodiment of the invention.

Referring to the illustrative drawings of FIG. 1 there is shown a cross-sectional view of a pressure sensor 20 in accordance with a first embodiment of the invention. The pressure sensor 20 includes a housing 22 molded from a polymer material. The polymer material can be any thermal plastic or thermal set material which is compatible with the environment in which the pressure sensor 20 is intended for use. The housing is penetrated by metal leads 24 and 25. The metal leads are capable of providing electrical contact with external circuitry (not shown). In the presently preferred embodiment the leads are copper. One of the metal leads 25 is "downset" so as to form a base 26 on which a semiconductor transducer 28 is mounted. The transducer 28 is secured to the base by an adherent material which exhibits an acceptable TCE match with the respective TCEs of the downset metal lead 25/26 and the semiconductor transducer 28. In a presently preferred embodiment, the material used to secure the semiconductor 28 to the base 26 is an epoxy cement 30 which firmly bonds the transducer 28 to the base 26.

Wire bonds 32 provide electrical contact between the semiconductor transducer and the certain of the leads 24. The electrical lead 25 that has been downset to serve as the base 26 does not require a wire bond. In addition, as explained below, one or more of the other metal leads 24 may lack wire bond connections. The housing 22 defines, together with the metal base 26, a chamber in which the transducer 28 is mounted. The chamber is open at the top to permit insertion and bonding of the transducer. The chamber is substantially filled with a silicone gel 34 which serves to protect the transducer from damage and contamination and also serves as a pressure transfer medium. A cap 36 is secured over the open top of the housing 22 to enclose the chamber. A vent hole 38 extends through the cap into the chamber. The pressure of a measurand environment is applied to the transducer through the vent hole The silicone gel transfers the pressure directly to the transducer.

The TCE of the transducer 28 and the metal base 26 are relatively well matched. Moreover the material 30 selected to secure them together also is chosen to be well matched to the TCEs of the transducer and the metal base. Hence, the transducer 28 can operate over a relatively wide range of temperatures without a significant risk of physical stress due to mismatch of the TCEs of the semiconductor transducer and the metal base. Furthermore, by electrically grounding the metal lead 25 which has a downset portion that serves as the base 26, the transducer can be shielded somewhat from the effects of RF signals. Finally, as explained below, by mounting the semiconductor transducer directly on a metal base, a better transfer of heat energy from the metal lead 25/26 to the semiconductor transducer 28 can be achieved during wire bonding.

Figure 2:
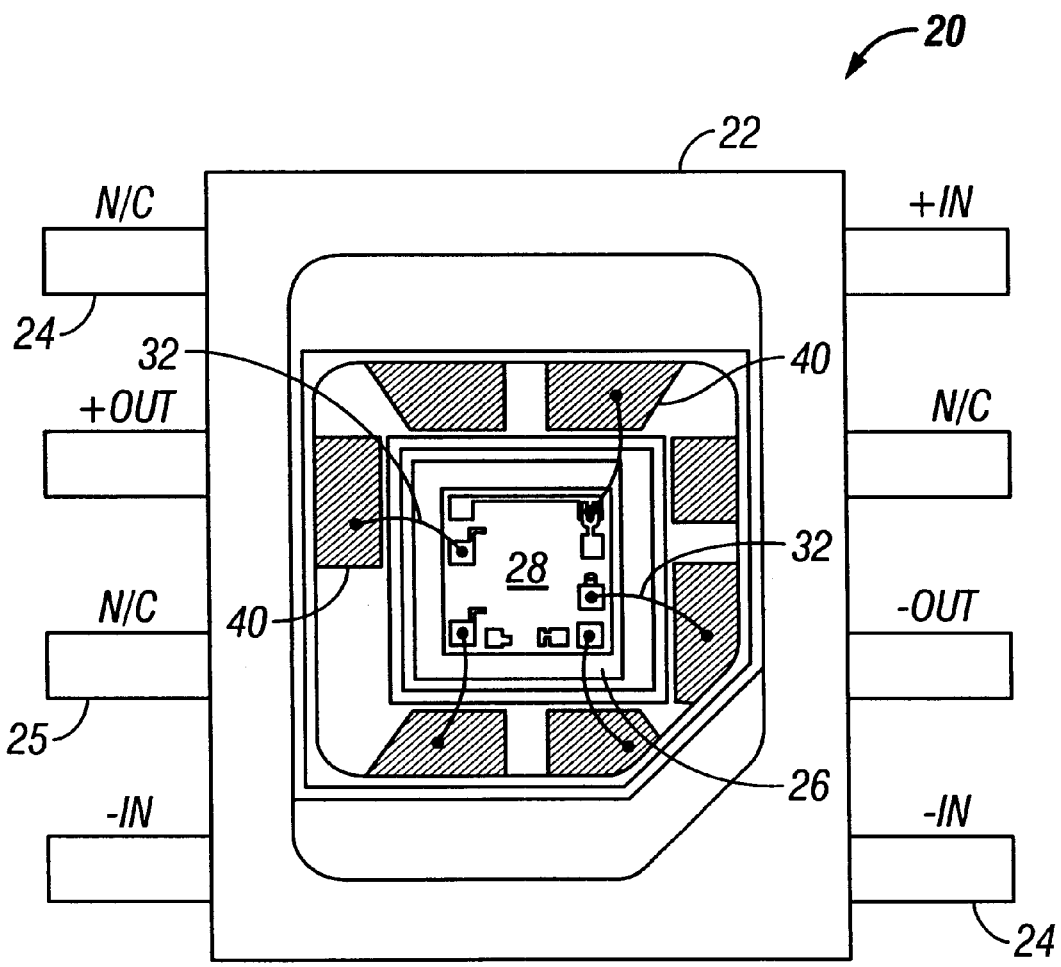
FIG. 2 is a top view of the pressure transducer of FIG. 1 with the silicone gel absent and the cap removed.

Referring to the illustrative drawing of FIG. 2, there is shown a top view of the pressure transducer 20 of FIG. 1 without the silicone gel 34 and with the cap 36 removed. The transducer 28 is mounted on the metal base 26 within the housing 22. Lead line 25 is downset to form the base 26. The electrical leads 24 are shown to penetrate the housing 22 so as to form contact regions 40 for the wire bonds 32.

Figure 3:
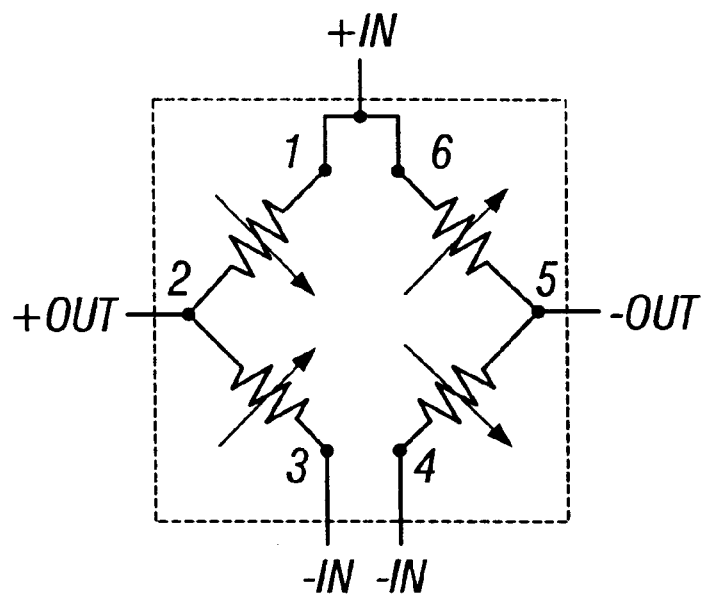
FIG. 3 is a circuit diagram showing the interconnection of transducer circuit elements and electrical leads for the semiconductor transducer FIG. 2.

The circuit diagram of FIG. 3 represents the circuit formed on the transducer 28 plus the metal leads wire bonded to the transducer. The resistors shown in the circuit diagram of FIG. 3 are circuit elements on the transducer 28. The operation of this circuit will be readily understood by those skilled in the art and need not be explained herein. The nodes labeled +IN, and −IN, +OUT and −OUT represent the identically labeled metal leads in FIG. 2. The metal leads of FIG. 2 labeled N/C are not interconnected with the transducer 28 in the current implementation. However, it will be appreciated that the number of leads and their interconnections to the transducer is not important to the invention.

Figure 4:
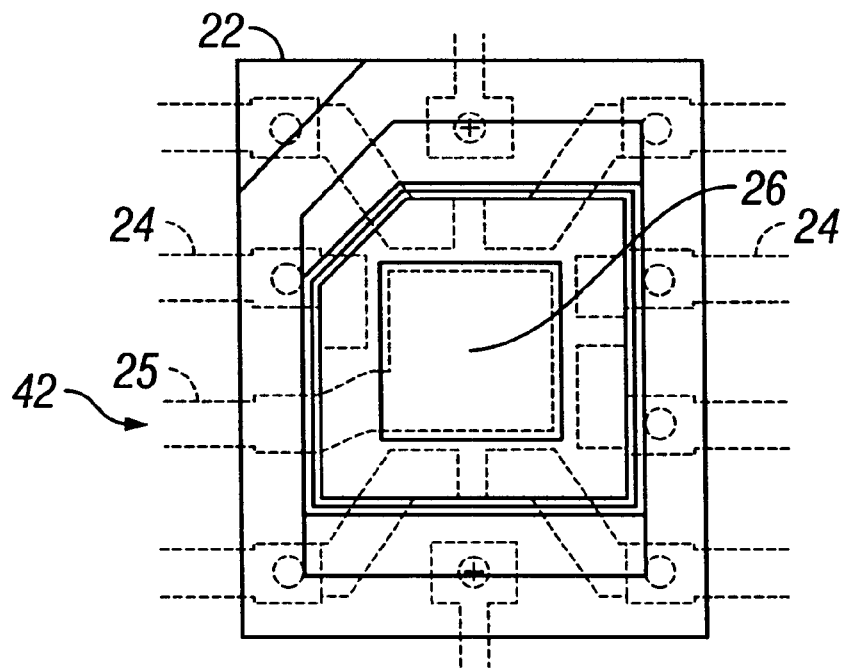
FIG. 4 is a top view of the housing and lead frame assembly of the sensor of FIG. 2.

Referring to the illustrative drawing of FIG. 4, there is shown a top view of the pressure sensor housing 22 superimposed on a top view of a lead frame assembly 42 similar to the view of FIG. 2. The housing 22 is illustrated with solid lines, and the lead frame assembly 42 is illustrated with dashed lines. It can be seen that the base 26 nearly is an extension of one of the lead frame members.

Figure 5A:
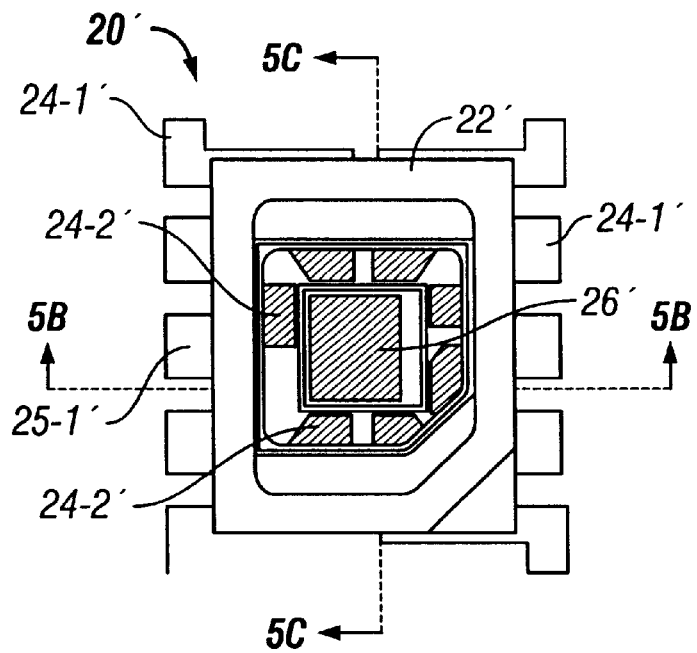
FIG. 5A is a top elevation view of an alternate embodiment of a housing and metal leads similar to the view of in FIG. 3 but without a transducer.

Referring to the illustrative drawing of FIG. 5A, there is shown a top view of alternate embodiment of a pressure sensor 20' in accordance with the invention. The view in FIG. 5A is similar to the view of FIG. 2 but with the transducer 28 removed. Elements in FIGS. 5A–5C that are the same as those of the first embodiment are labelled with primed reference numerals identical to those used to reference corresponding elements in the first embodiment. The housing 22' is shown together with external portions 24-1' of the metal leads that are external to the housing 22' and internal portions 24-2' that are internal to the housing 22'. The base 26' is shown within the housing as well.

Figure 5B:
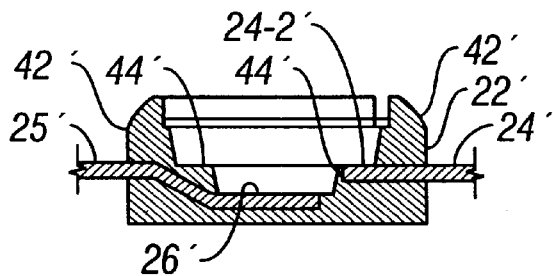
FIG. 5B is a side cross-sectional view along lines 5B—5B of FIG. 5A.

Referring to the illustrative drawing of FIG. 5B, there is shown a cross-sectional view of the alternative housing and lead frame taken generally along lines 5B—5B of FIG. 5A. The housing 22' is similar in all respects to the housing 22 of the first embodiment described above, except that the alternative polymer housing 22' extends fully beneath the metal base 26'. Thus, the base 26' is embedded within the housing 22' which extends beneath it. In essentially all other respects, the housings 22 and 22' of the first embodiment and the alternative embodiment are the same. Thus, the following description of the alternative housing 22' applies to the housing 22 of the first embodiment as well.

The housing comprises 22' walls 42' which upstand from the region of the metal base 26'. The walls 42' are internally contoured to define a shelf region 44' which extends above the base. As shown in FIG. 5B, the internal portions 24-2' of the metal leads are exposed in the shelf region so as to be available for wire bonding with the semiconductor transducer. It will be appreciated that the internal sides of the walls 42' are inclined slightly so as to facilitate insertion of the semiconductor transducer.

Figure 5C:
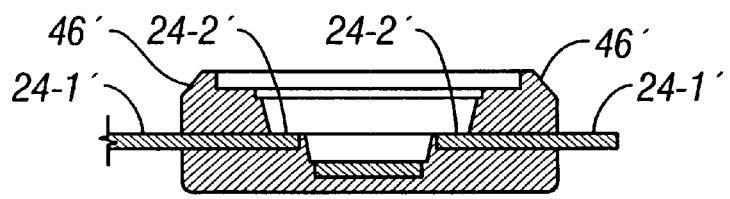
FIG. 5C is a side cross-sectional view along lines 5C—5C of FIG. 5A.

Referring to the illustrative drawing of FIG. 5C, there is shown a cross-sectional view of a housing and lead frame taken along lines 5C—5C of FIG. 5A. Note that in this view, there are two exposed internal portions 24-2' of metal leads in the shelf region 44'. Also, note the rim portion 46' that follows the top perimeter of the walls 42' and that is contoured to interfit with a channel of the cap 36 as described below.

Figure 6A:
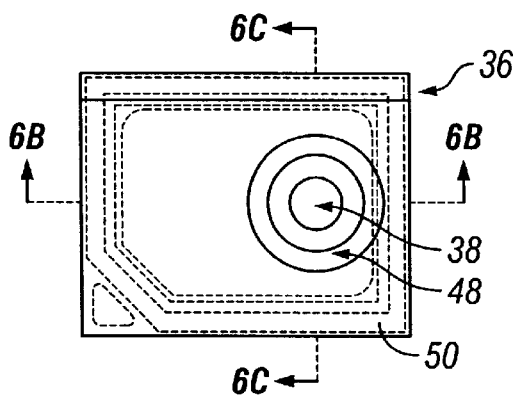
FIG. 6A is a top elevation view of a cap for either of the embodiments of FIGS. 1–4 or the embodiment of FIGS. 5A–5C.

Referring to FIG. 6A, there is shown a top view of the cap 36. The same cap is used for both embodiments discussed herein. The cap 36 includes a vent hole 38. The two concentric lines surrounding vent hole 38 represent a circular grove 48 which can be used to secure a gasket, for example. The dashed lines about the perimeter of the cap 36 represent the path of the channel 50 described below.

Figure 6B:
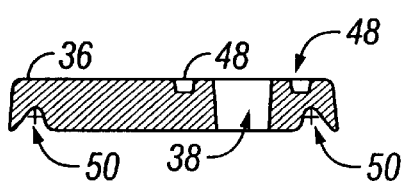
FIG. 6B is a side cross-sectional view along lines 6B—6B of FIG. 6A.
Figure 6C:
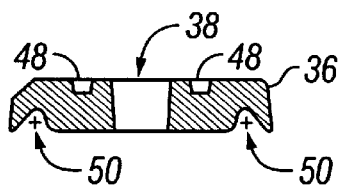
FIG. 6C is a side cross-sectional view along lines 6C—6C of FIG. 6A.

Referring to the illustrative drawings of FIGS. 6B and 6C, there are shown cross-sectional views of the cap generally along lines 6B—6B and 6C—6C. A channel 50 follows the perimeter of the cap. It interfits with the rim portion 46' of the housing 22. It will be appreciated, that the rim portion is the same for the first housing embodiment and for the alternative housing embodiment. During assembly of a pressure sensor 20 or 20', the channel is filled with an adherent material in order to secure the cap 36 to the rim portion of a housing.

Figure 7:
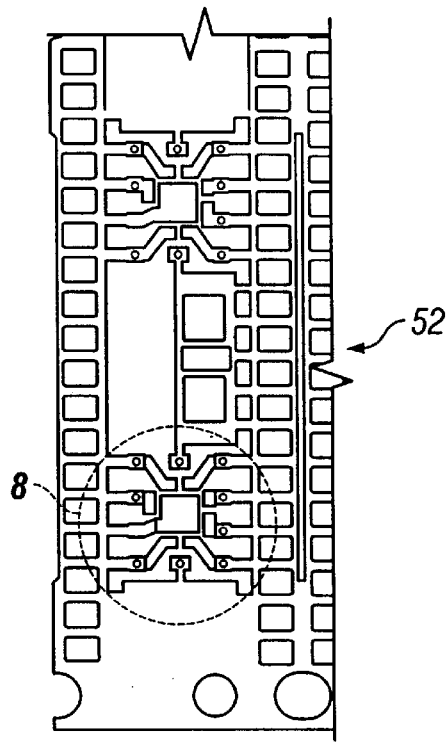
FIG. 7 is a top elevation view of a lead frame structure in accordance with the invention.
Figure 8:
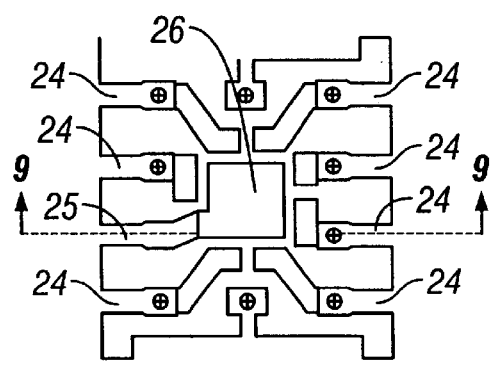
FIG. 8 is an enlarged portion of the lead frame shown within the dashed line circle of FIG. 7.
Figure 9:
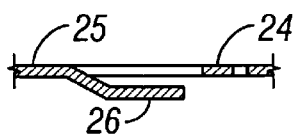
FIG. 9 is a side view of the portion of FIG. 8 showing the "downset" base.
Figure 10:
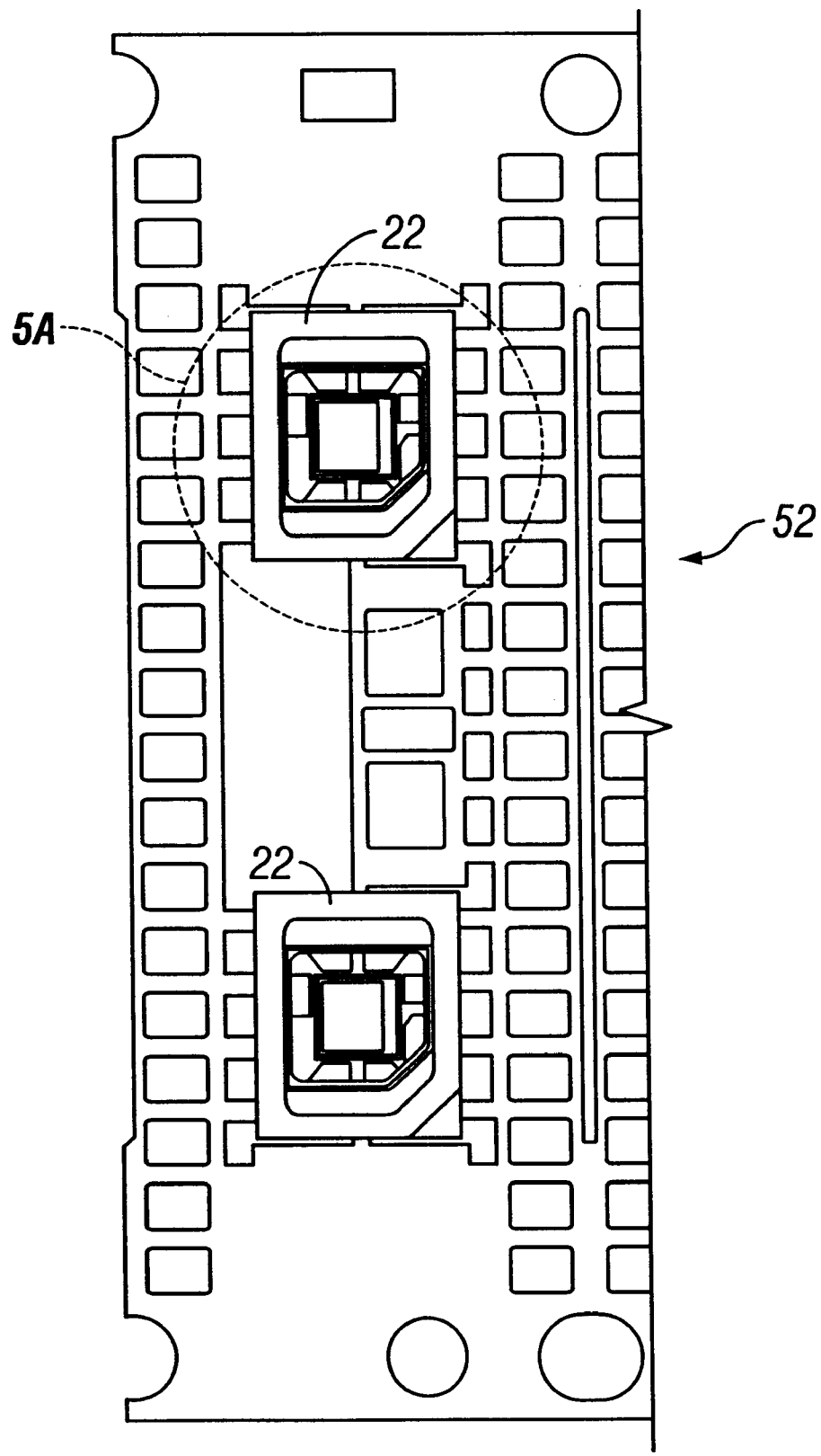
FIG. 10 is a top elevation view of a lead frame like that of FIG. 7 with housing bodies molded thereon.

Referring to FIG. 7, there is shown a lead frame structure 52. FIG. 8 shows details of one of the lead frame units of the structure. FIG. 9 shows the downset of the base 26 relative to the other metal leads 24 and 25. FIG. 10 shows housings 22 molded over two lead frame units.

During manufacture, the lead frame of FIG. 7 is formed. The base portions are downset as shown in FIG. 9. The packages are molded onto the lead frame as shown in FIG. 10. The sensors are epoxied to the bases. The epoxy is thermally cured to set it. The transducers are wire bonded to the metal leads. The housings are filled with silicone. The silicone is heated to set it as gel. Adherent material is deposited into the cap channels, and the caps are put in place. The enclosed package is heated to set the adherent material. The leads are trimmed from the frame and are formed into a gull winged shape.

While two embodiments of the invention have, been described and illustrated, it will be appreciated that modification can be made to these embodiments without departing from the spirit of the invention. Thus, the invention is intended to be defined in terms of the following claims.

What is claimed is:

1. A pressure transducer package for housing a pressure transducer comprising:
   a metal lead having a downset portion, and a widened end portion upon which said pressure transducer is secured; and
   a plurality of polymeric walls forming a chamber, said metal lead extending through one of said walls such that said widened end portion is contained in said chamber wherein said downset portion is supported by a bottom polymeric wall.

2. The pressure transducer package of claim 1, wherein said bottom polymeric wall extends beneath said widened end portion.

3. The pressure transducer package of claim 1 wherein said bottom polymeric wall does not extend beneath said widened end portion such that a bottom surface of said widened end portion is uncovered.

4. The pressure transducer package of claim 1 further comprising a plurality of electrical leads extending through said walls and into the chamber.

5. The pressure transducer package of claim 4 wherein said widened end portion is planar.

6. The pressure transducer package of claim 5 wherein the widened end portion is downset from another portion of the metal lead.

7. The pressure transducer package of claim 6, wherein the widened end portion is grounded.

8. The pressure transducer package of claim 4 wherein the plurality of polymeric walls define an access port for inserting said pressure transducer.

9. The pressure transducer package of claim 8, wherein the chamber includes a shelf region defined by said walls and opposite the access port, and wherein portions of the leads are partially embedded in the shelf region and portions of the leads are partially exposed opposite the access port.

10. The pressure transducer package of claim 8, further comprising a cap positioned in said access port, said cap having a vent hole.

11. The pressure transducer package of claim 1 further comprising a pressure transducer secured to said widened end portion.

12. The pressure transducer package of claim 11 comprising a silicon gel disposed in said chamber.

13. The pressure transducer package of claim 11 wherein the pressure sensor is secured to said end portion with an epoxy.

14. The pressure transducer package of claim 13 wherein said polymeric walls are thermoset.

15. The pressure transducer package of claim 11 wherein said metal lead has a thermal co-efficient of expansion closely matched to that of said pressure transducer.

16. A pressure transducer package for housing a pressure transducer comprising:
   a metal lead having a downset portion, and a base portion upon which said pressure transducer is secured; and
   a plurality of polymeric walls forming a chamber, said metal lead extending through one of said walls such that said base portion is contained in said chamber wherein said downset portion is encapsulated by a polymeric wall.

17. The pressure transducer package of claim 16 further comprising a plurality of electrical leads extending through said walls and into the chamber.

18. The pressure transducer package of claim 17 wherein said base portion is planar.

19. The pressure transducer package of claim 18 wherein the base portion is downset from another portion of the metal lead.

20. The pressure transducer package of claim 19 wherein the base portion is grounded.

21. The pressure transducer package of claim 17 wherein the plurality of polymeric walls define an access port for inserting said pressure transducer.

22. The pressure transducer package of claim 21 further comprising a cap positioned in said access port, said cap having a vent hole.

23. The pressure transducer package of claim 21 wherein the chamber includes a shelf region defined by said walls and opposite the access port, and wherein portions of the leads are partially embedded in the shelf region and portions of the leads are partially exposed opposite the access port.

24. The pressure transducer package of claim 16 further comprising a pressure transducer secured to said base portion.

25. The pressure transducer package of claim 24 comprising a silicon gel disposed in said chamber.

26. The pressure transducer package of claim 24 wherein the pressure sensor is secured to said end portion with an epoxy.

27. The pressure transducer package of claim 26 wherein said polymeric walls are thermoset.

28. The pressure transducer package of claim 24 wherein said metal lead has a thermal co-efficient of expansion closely matched to that of said pressure transducer.

29. The pressure transducer package of claim 16 wherein a bottom polymeric wall extends beneath said base portion.

30. The pressure transducer package of claim 16 wherein a bottom polymeric wall does not extend beneath said base portion such that a bottom surface of said base portion is uncovered.

31. The pressure transducer package of claim 16, wherein said base portion is a widened end portion.

* * * * *

US006559379C1

(12) INTER PARTES REEXAMINATION CERTIFICATE (1049th)
United States Patent
Solanki et al.

(10) Number: US 6,559,379 C1
(45) Certificate Issued: Feb. 9, 2015

(54) PRESSURE SENSOR WITH TRANSDUCER MOUNTED ON A METAL BASE

(75) Inventors: Dinesh Solanki, Santa Clara, CA (US); Janusz Bryzek, Fremont, CA (US)

(73) Assignee: GE Thermometrics, Inc., St. Marys, PA (US)

Reexamination Request:
No. 95/001,784, Oct. 13, 2011

Reexamination Certificate for:
Patent No.: 6,559,379
Issued: May 6, 2003
Appl. No.: 09/815,900
Filed: Mar. 22, 2001

Related U.S. Application Data

(63) Continuation of application No. 08/949,850, filed on Oct. 14, 1997, now abandoned, which is a continuation of application No. 08/393,956, filed on Feb. 24, 1995, now abandoned.

(51) Int. Cl.
*H05K 5/06* (2006.01)

(52) U.S. Cl.
USPC .............................. 174/533; 174/556; 257/676

(58) Field of Classification Search
None
See application file for complete search history.

(56) References Cited

To view the complete listing of prior art documents cited during the proceeding for Reexamination Control Number 95/001,784, please refer to the USPTO's public Patent Application Information Retrieval (PAIR) system under the Display References tab.

*Primary Examiner* — Kenneth J Whittington

(57) ABSTRACT

A three piece housing, designed to house semiconductor chips is molded using a polymer material. The chip sits on a metal base. Electrical leads pass through a molded housing to provide electrical contact between the semiconductor chip and external circuitry.

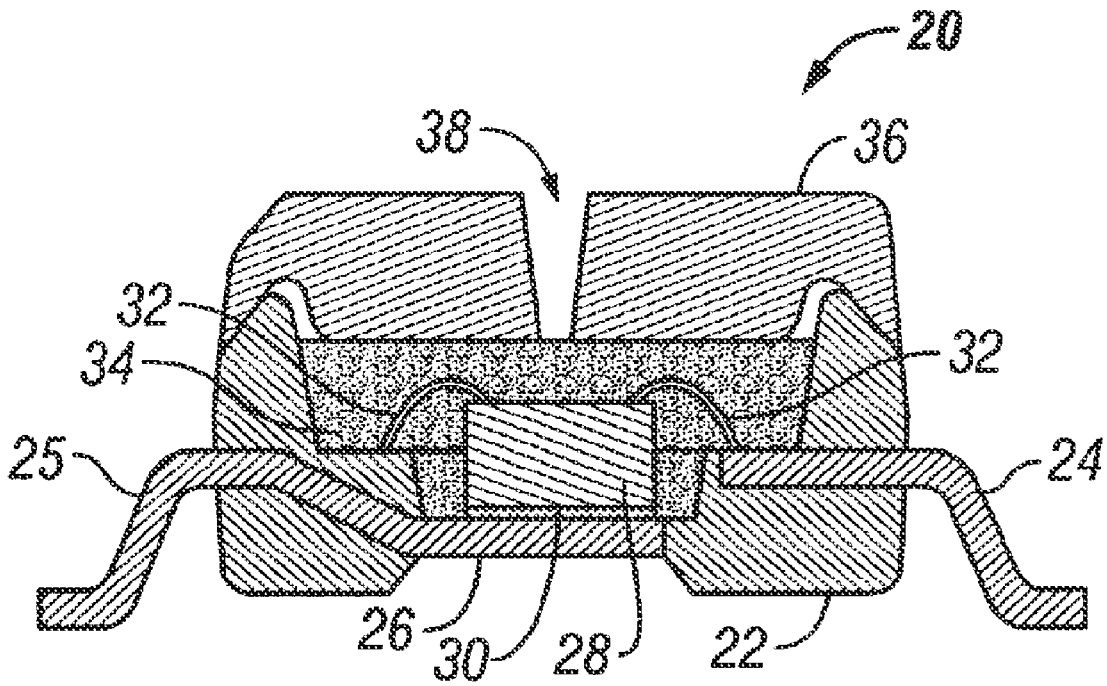

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

Claims 1-31 are cancelled.

\* \* \* \* \*